(12) United States Patent
Zhan et al.

(10) Patent No.: US 11,164,834 B2
(45) Date of Patent: Nov. 2, 2021

(54) WAFER STRUCTURE AND METHOD FOR MANUFACTURING THE SAME, AND CHIP STRUCTURE

(71) Applicant: Wuhan Xinxin Semiconductor Manufacturing Co., Ltd., Hubei (CN)

(72) Inventors: Di Zhan, Hubei (CN); Tianjian Liu, Hubei (CN); Guoliang Ye, Hubei (CN)

(73) Assignee: Wuhan Xinxin Semiconductor Manufacturing Co., Ltd., Wuhan (CN)

( * ) Notice: Subject to any disclaimer, the term of this patent is extended or adjusted under 35 U.S.C. 154(b) by 108 days.

(21) Appl. No.: 16/579,674

(22) Filed: Sep. 23, 2019

(65) Prior Publication Data
US 2020/0388586 A1 Dec. 10, 2020

(30) Foreign Application Priority Data
Jun. 10, 2019 (CN) .......................... 201910497419.5

(51) Int. Cl.
*H01L 27/146* (2006.01)
*H01L 23/00* (2006.01)

(52) U.S. Cl.
CPC .............. *H01L 24/08* (2013.01); *H01L 24/03* (2013.01); *H01L 24/16* (2013.01); *H01L 2924/35121* (2013.01)

(58) Field of Classification Search
None
See application file for complete search history.

(56) References Cited

U.S. PATENT DOCUMENTS

2004/0195642 A1* 10/2004 Angell .................... H01L 24/05
257/459
2009/0079082 A1 3/2009 Liu et al.
(Continued)

FOREIGN PATENT DOCUMENTS

| CN | 101789391 A | 7/2010 |
| CN | 102543921 A | 7/2012 |
| CN | 104681537 | * 6/2015 |

(Continued)

OTHER PUBLICATIONS

First Chinese Office Action regarding Application No. 201910497419.5 dated Jun. 2, 2020. English translation provided by Unitalen Attorneys at Law.

*Primary Examiner* — Ali Naraghi
(74) *Attorney, Agent, or Firm* — Harness, Dickey & Pierce, P.L.C.

(57) ABSTRACT

A wafer structure, a method for manufacturing the wafer structure, and a chip structure are provided. In a case that two wafers are bonded together, an opening extending through a substrate of one of the wafers is formed at a back surface of the wafer, and a concave-convex structure is formed in the dielectric layer under the opening. At least one of concave portions of the concave-convex structure extends to expose the interconnection layer of the wafer structure. A pad is formed on the concave-convex structure by filling the concave-convex structure, and the pad has the same concave-convex arrangement as the concave-convex structure. In this way, the pad has a concave-convex surface, such that a contact surface area of the pad is effectively increased without increasing a floor space of the pad.

10 Claims, 10 Drawing Sheets

(56) References Cited

U.S. PATENT DOCUMENTS

2016/0233264 A1\* 8/2016 Kagawa ............ H01L 27/14687
2019/0259800 A1\* 8/2019 Ku .................... H01L 27/14636

FOREIGN PATENT DOCUMENTS

| CN | 104681537 A | 6/2015 |
| CN | 104867865 A | 8/2015 |
| CN | 105575829 A | 5/2016 |
| EP | 0635885 A1 | 1/1995 |

\* cited by examiner

WAFER STRUCTURE AND METHOD FOR MANUFACTURING THE SAME, AND CHIP STRUCTURE

The present application claims priority to Chinese Patent Application No. 201910497419.5, titled "WAFER STRUCTURE AND METHOD FOR MANUFACTURING THE SAME, AND CHIP STRUCTURE", filed on Jun. 10, 2019 with the Chinese Patent Office, which is incorporated herein by reference in its entirety.

FIELD

The present disclosure relates to the technical field of semiconductor devices and manufacturing methods thereof, and in particular to a wafer structure, a method for manufacturing the wafer structure, and a chip structure.

BACKGROUND

With the continuous development of semiconductor technologies, the three-dimensional integrated circuit (3D-IC) technology is widely used, which has advantages of a high performance, a low cost and a high integration degree. The 3D-IC technology is realized by stacking and bonding wafers with different functions together with a wafer-level packaging technology.

In an implementation of the wafer-level packaging technology, in a case that two wafers are bonded together, a pad is formed on a back surface of one of the two wafers, and a solder ball is formed on the pad, with which electrical connection to an interconnection structure in the wafer may be performed. However, once the solder ball is peeled off from the pad, the chip may not operate normally.

SUMMARY

In view of this, a wafer structure, a method for manufacturing the wafer structure, and a chip structure are provided according to the present disclosure, to enlarge a surface area of a pad, such that a bonding force between the pad and a solder ball is increased.

A method for manufacturing a wafer structure is provided according to an embodiment of the present disclosure, which includes: providing a wafer bonding structure including a first wafer and a second wafer, where a front surface of the first wafer is bonded to a front surface of the second wafer, and the first wafer includes a first substrate, a dielectric layer on the first substrate, and an interconnection layer on the dielectric layer; forming an opening at a back surface of the first wafer, where the opening extends through the first substrate; forming a concave-convex structure in the dielectric layer under the opening, where the concave-convex structure includes concave portions and convex portions that are alternately arranged, and at least one of the concave portions extends to expose the interconnection layer; and filling the concave-convex structure, to form a pad on the concave-convex structure, where the pad has a same concave-convex arrangement as the concave-convex structure.

In an embodiment, after the forming the opening and before the forming the concave-convex structure, the method for manufacturing a wafer structure further includes: forming a protective layer made of an insulating material on a surface of the opening. In this case, the forming the concave-convex structure in the dielectric layer under the opening includes: etching the protective layer and the dielectric layer, to form the concave-convex structure in the dielectric layer under the opening, where a part of the protective layer and the dielectric layer under the part of the protective layer are etched away to form the concave portions of the concave-convex structure, and another part of the protective layer and the dielectric layer under the another part of the protective layer are remained without etching to form the convex portions of the concave-convex structure.

In an embodiment, the forming the concave-convex structure in the dielectric layer under the opening includes: forming a mask layer with an etching pattern at a bottom of the opening via a photolithography process, where the etching pattern includes first patterns and second patterns that are spaced apart from each other, and the first patterns have a greater line width than that of the second patterns; performing an etching process under masking of the mask layer, to partially remove the dielectric layer under the second pattern and completely remove the dielectric layer under the first pattern, to form the concave-convex structure having both concave portions not extending through the dielectric layer and concave portions extending through the dielectric layer; and removing the mask layer.

In an embodiment, the filling the concave-convex structure, to form a pad on the concave-convex structure includes: depositing a pad material, to fill up the concave-convex structure with the pad material; and etching the pad material, to form the pad on the concave-convex structure.

In an embodiment, the method for manufacturing a wafer structure further includes: forming a solder ball on the pad.

In an embodiment, the concave portions include through concave portions extending through the dielectric layer and non-through concave portions not extending through the dielectric layer. Each of the through concave portions is arranged at a region close to a sidewall of the opening, and each of the non-through concave portions is arranged at a region away from the sidewall of the opening.

A chip structure is further provided according to an embodiment of the present disclosure. The chip structure includes a chip bonding structure, an opening, a concave-convex structure, and a pad. The chip bonding structure includes a first chip and a second chip. A front surface of the first chip is bonded to a front surface of the second chip. The first chip includes a first substrate, a dielectric layer on the first substrate, and an interconnection layer on the dielectric layer. The opening is arranged at a back surface of the first chip and extends through the first substrate. The concave-convex structure is arranged in the dielectric layer under the opening. The concave-convex structure includes concave portions and convex portions that are alternately arranged, and at least one of the concave portions extends to expose the interconnection layer. The pad is arranged on the concave-convex structure and is configured to fill up the concave-convex structure. The pad has the same concave-convex arrangement as the concave-convex structure.

In an embodiment, the chip structure further includes a sidewall of the opening and a protective layer. The protective layer is made of an insulating material and is arranged between the pad and each of the convex portions.

In an embodiment, the concave portions include through concave portions extending through the dielectric layer and non-through concave portions not extending through the dielectric layer. Each of the through concave portions is arranged at a region close to the sidewall of the opening, and each of the non-through concave portions is arranged at a region away from the sidewall of the opening.

In an embodiment, each of the through concave portions has a strip shape, and the non-through concave portions each has a block shape and are arranged in an array, or the non-through concave portions each has a strip shape and are arranged in columns, or the non-through concave portions are arranged in a nested arrangement, or the non-through concave portions are arranged in a crisscross arrangement.

A wafer structure is further provided according to an embodiment of the present disclosure, which includes a wafer bonding structure. The wafer bonding structure includes the above chip structures arranged in an array.

With the wafer structure, the method for manufacturing a wafer structure, and the chip structure according to the embodiments of the present disclosure, in a case that two wafers are bonded together, an opening extending through a substrate of one of the wafers is formed at a back surface of the wafer, and a concave-convex structure is formed in the dielectric layer under the opening. At least one of concave portions of the concave-convex structure extends to expose the interconnection layer of the wafer structure. A pad is formed on the concave-convex structure by filling the concave-convex structure, and the pad has the same concave-convex arrangement as the concave-convex structure. In this way, the pad has a concave-convex surface, such that a contact surface area of the pad is effectively increased without increasing a floor space of the pad, that is, a bonding area between the pad and a solder ball can be increased. Further, a bonding force between the pad and the solder ball is increased, thereby preventing the solder ball from being peeled off from the pad due to a poor bonding force between the solder ball and the pad, thus prolonging an operation life of the chip.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. Apparently, the drawings in the following description show only some embodiments of the present disclosure, and other drawings may be obtained by those skilled in the art from the drawings without any creative work.

DETAILED DESCRIPTION OF EMBODIMENTS

In order to make the above objects, features and advantages become apparent, embodiments of the present disclosure are described below in detail with reference to the drawings.

Multiple details are described in the following descriptions, so as to fully understand the present disclosure. However, the present disclosure may be implemented by other ways different from the way described herein. Similar promotions can be made by those skilled in the art without departing from the spirit of the present disclosure. Therefore, the present disclosure is not limited to the specific embodiments described in the following.

The present disclosure is described in detail with reference to the schematic diagrams. For convenience of description, sectional views showing structures of devices may be partially enlarged not based on a general proportion. The schematic diagrams are merely exemplary, and the protection scope of the present disclosure is not limited hereto. Further, three-dimensional dimension including a length, a width and a depth should be included in practice.

As described in the background part, in a case that two wafers are bonded together, a pad is formed on a back surface of one of the wafers, and a solder ball is formed on the pad, to achieve electrical connection to an interconnection structure in the wafer. However, once the solder ball is peeled off from the pad, the chip may not operate normally.

Therefore, a wafer structure, a method for manufacturing a wafer structure, and a chip structure are provided according to the present disclosure. In a case that two wafers are bonded together, an opening extending through a substrate of one of the wafers is formed at a back surface of the wafer, and a concave-convex structure is formed in the dielectric layer under the opening. At least one of concave portions of the concave-convex structure extends to expose the interconnection layer of the wafer structure. A pad is formed on the concave-convex structure by filling the concave-convex structure, and the pad has the same concave-convex arrangement as the concave-convex structure. In this way, the pad has a concave-convex surface, such that a contact surface area of the pad is effectively increased without increasing a floor space of the pad, that is, a bonding area between the pad and a solder ball can be increased. Further, a bonding force between the pad and the solder ball is increased, thereby preventing the solder ball from being peeled off from the pad due to a poor bonding force between the solder ball and the pad, thus prolonging an operation life of the chip.

In order to make a better understanding of the technical solutions and the technical effects of the present disclosure, specific embodiments are described in detail below with reference to FIGS. 1, 1A and 2 to 9.

Figure 1:
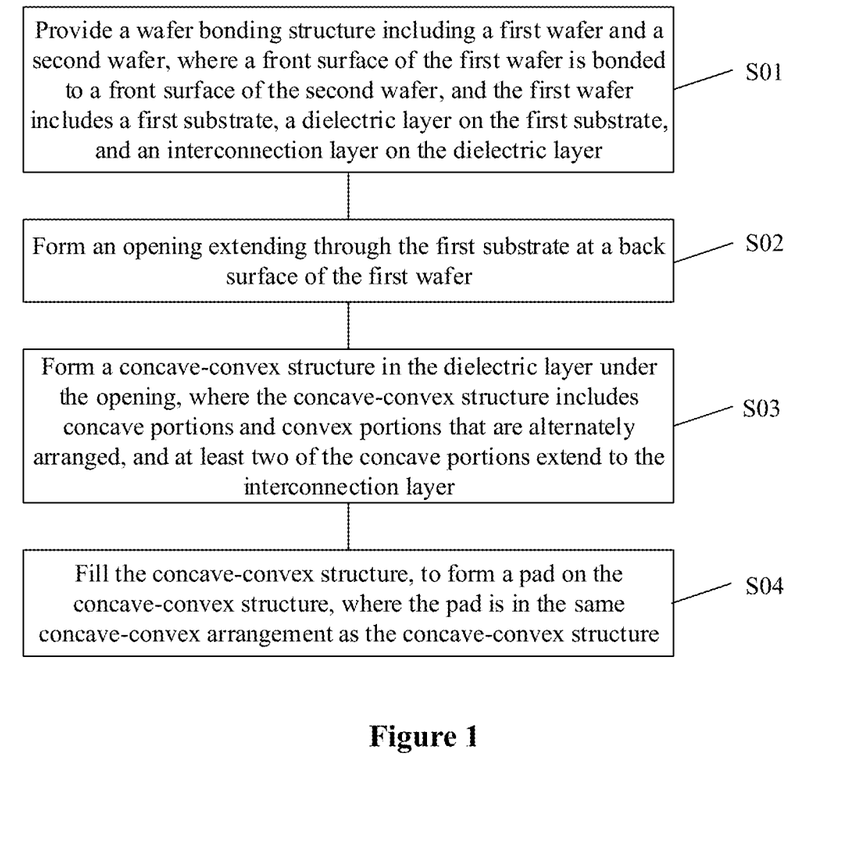
FIG. 1 is a schematic flowchart of a method for manufacturing a wafer structure according to an embodiment of the present disclosure.
Figure 2:
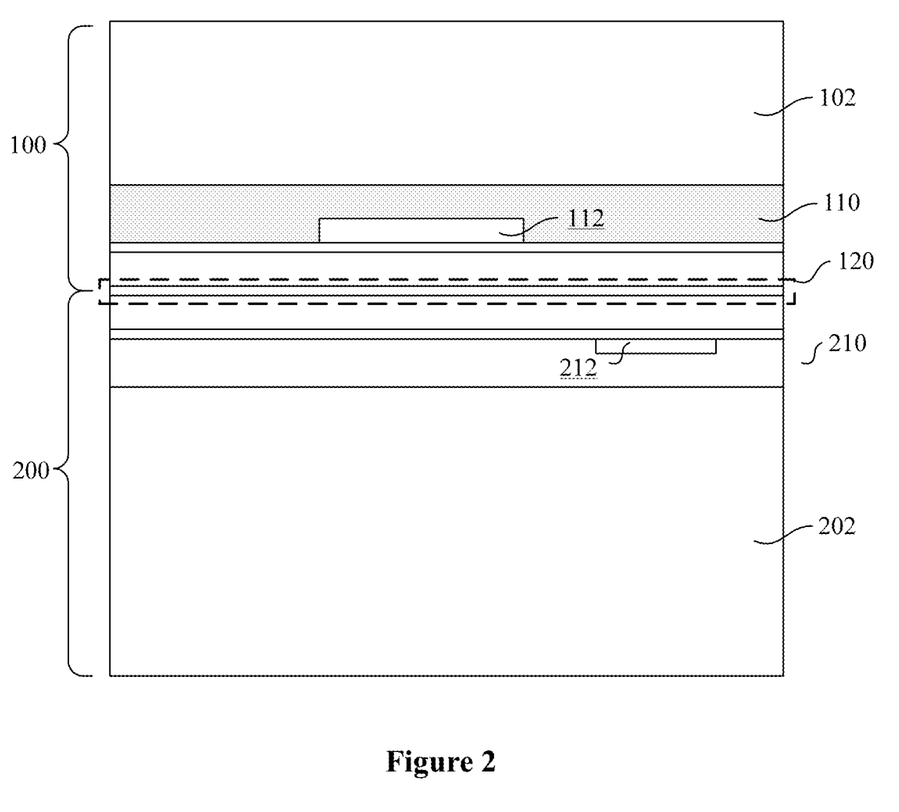
FIGS. 2 to 9 are schematic cross-sectional views of structures formed during a process of forming a wafer structure with the method for manufacturing a wafer structure according to an embodiment of the present disclosure.

As shown in FIG. 1, in step S01, a wafer bonding structure is provided. As shown in FIG. 2, the wafer bonding structure includes a first wafer 100 and a second wafer 200, and a front surface of the first wafer 100 is bonded to a front surface of the second wafer 200. The first wafer 100 includes a first substrate 102, a dielectric layer 110 on the first substrate 102, and an interconnection layer 112 on the dielectric layer 110.

In an embodiment of the present disclosure, before the first wafer 100 is bonded to the second wafer 200, each of the first wafer 100 and the second wafer 200 is provided with devices that are required and an interconnection structure for electrically connecting the devices. The devices may be covered by a dielectric structure. The dielectric structure may be of a lamination form, and includes an interlayer dielectric layer, an intermetallic dielectric layer, a bonding layer and the like. The interconnection structure is arranged in the dielectric structure. The devices may include a metal oxide semiconductor (MOS) device, a storage device and/or other passive devices. The storage device may include a nonvolatile memory, a random-access memory or the like. The nonvolatile memory may include a ferroelectric memory, a phase change memory, or a floating gate field-effect transistor such as an NOR flash memory, a NAND flash memory. The device may be a planar device or a three-dimensional device. The three-dimensional device may be, for example, a fin field-effect transistor (Fin-FET), a three-dimensional memory or the like. The interconnection structure may include a contact plug, a through hole, and an interconnection layer. The interconnection layer may include one or more layers. The interconnection structure may be made of a metal material, such as tungsten, aluminum, or copper.

Figure 1A:
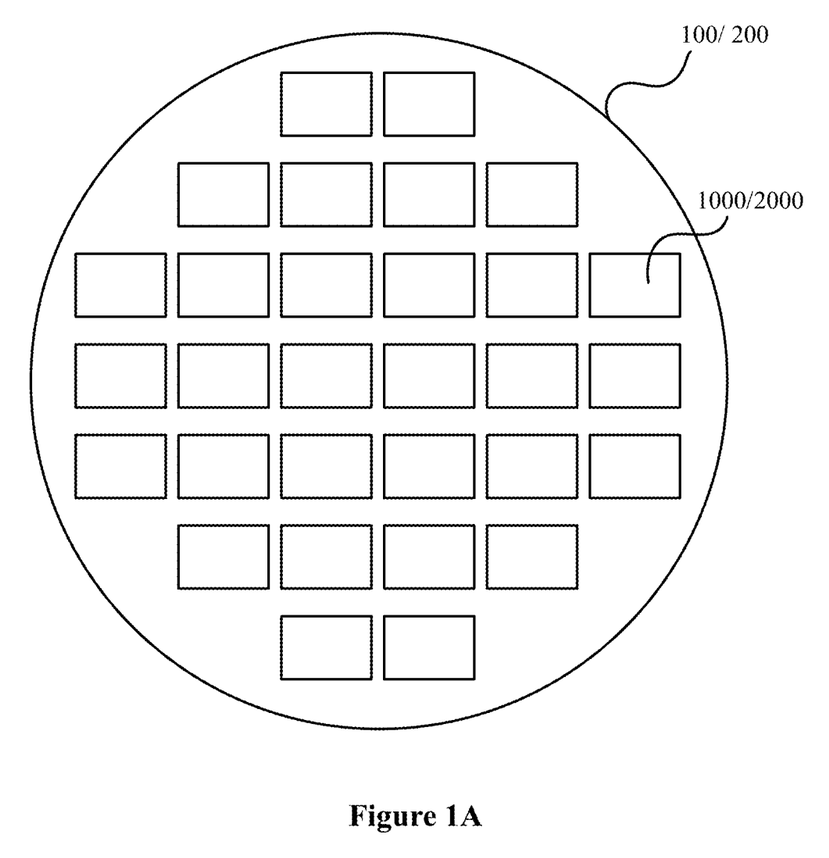
FIG. 1A is a schematic top view of a first wafer or a second wafer used in the method for manufacturing a wafer structure according to an embodiment of the present disclosure.

Reference is made to FIG. 1A, which is a schematic top view of the first wafer 100 or the second wafer 200 before the bonding process. First chips 1000 are arranged in an array on the first wafer 100, and second chips 2000 are arranged in an array on the second wafer 200. The front surface of the first wafer 100 is bonded to the front surface of the second wafer 200, to form a bonding structure. In the bonding structure, each of the first chips 1000 on the first wafer 100 is arranged facing toward a second chip 2000 on the second wafer, to form a chip stacking arrangement. It is to be noted that FIGS. 2 to 9 show partial cross-sectional views of a bonding structure having the chip stacking arrangement.

In an embodiment of the present disclosure, the first wafer 100 and the second wafer 200 may be provided with different devices, which may be, for example, devices of different types, or devices of the same type that have different operating voltages. In addition, devices on one wafer may be identical to or different from each other.

The devices on each of the first wafer 100 and the second wafer 200 are arranged on respective substrates. For convenience of description, a substrate of the first wafer 100 is referred to as the first substrate 102, and a substrate of the second wafer 200 is referred to as a second substrate 202. A surface of the first substrate 102 on which devices are arranged is referred to as the front surface of the first wafer 100. A surface of the second substrate 202 on which devices are arranged is referred to as the front surface of the second wafer 200. A surface opposite to the surface of the first substrate 102 on which the devices are arranged is referred to as a back surface of the first wafer 100. A surface opposite to the surface of the second substrate 202 on which the devices are arranged is referred to as a back surface of the second wafer 200.

A bonding material layer may be formed on each of the front surface of the first wafer 100 and the front surface of the second wafer 200. Depending on different designs and bonding manners, the bonding material layer may be a bonding layer of the dielectric structure, which is made of, for example, silicon oxide or silicon nitride. The two wafers are bonded together via a molecular force between two bonding layers. Alternatively, the two wafers may also be bonded together in a hybrid bonding manner, in which each of the front surface of the first wafer 100 and the front surface of the second wafer 200 is arranged with the bonding layer of the dielectric structure and a metallic bonding hole, and the metallic bonding hole at the front surface of the first wafer 100 is aligned with the metallic bonding hole at the front surface of the second wafer 200, such that the two wafers are bonded together in the hybrid bonding manner. In this way, the front surface of the first wafer 100 is bonded to the front surface of the second wafer 200, to form a bonding layer 120 between the two wafers. Depending on different bonding manners, the bonding layer 120 may include the bonding layers of the dielectric structures, or may include the bonding layers of the dielectric structures and the metallic bonding holes.

In an embodiment of the present disclosure, in the bonding structure, the first wafer 100 is arranged above the second wafer 200. Further, a pad is formed on the back surface of the wafer 100, which is electrically connected to the interconnection layer of the first wafer 100, such that electrical connection to the interconnection layer of the first wafer 100 is achieved. The dielectric layer 110 of the first wafer 100 may include one or more layers in the dielectric structure of the first wafer. The interconnection layer 112 in the dielectric layer 110 may be an interconnection layer in the interconnection structure of the first wafer 100.

Figure 3:
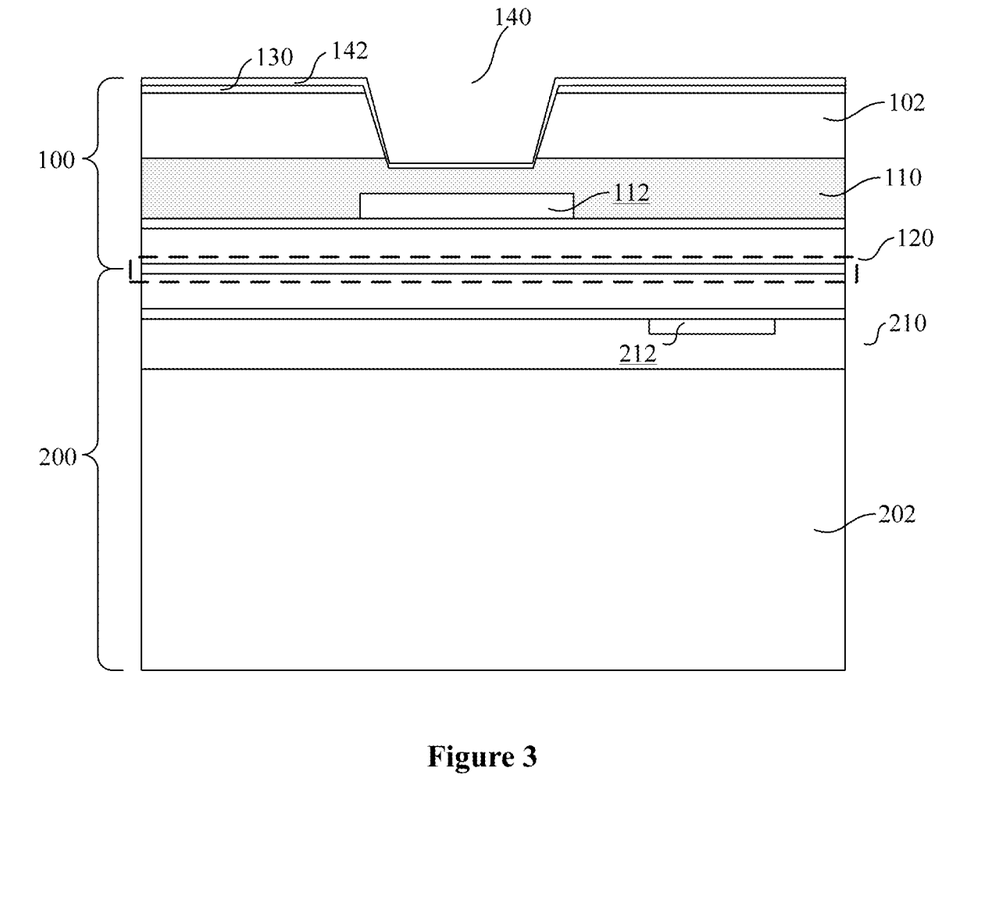

In practice, the first wafer 100 may be bonded to the second wafer 200 with a bonding apparatus. In a case that the first wafer 100 is bonded to the second wafer 200, a thinning process may be performed at the back surface of the first wafer 100 on the first substrate 102, to form a thinned bonding structure, as shown in FIG. 3. Specifically, the first substrate 102 may be thinned via two thinning processes, first, the first substrate 102 is coarsely thinned via a chemical mechanical grinding process, then the first substrate 102 is finely thinned via a wet etching process. In this way, a high degree planarization can be achieved high effectively with the thinning processes.

In step S02, an opening 140 extending through the first substrate 102 is formed at the back surface of the first wafer 100, as shown FIG. 3.

As shown in FIG. 3, the opening 140 is arranged above the interconnection layer 112, and is used to form a pad connected to the interconnection layer 112.

In some embodiments, a hard mask layer 130 may be formed on the first substrate 102 at the back surface of the wafer 100. The hard mask layer 130 may be made of silicon oxide, silicon nitride, silicon oxynitride or the like. Alternatively, the hard mask layer 130 may include layers each of which is made of silicon oxide, silicon nitride, silicon oxynitride or the like. Then, a photoresist layer is formed on the hard mask layer 130, and a pattern of the opening is formed on the photoresist layer via a photolithography process. The hard mask layer 130 is processed to have the same pattern as the photoresist layer via an etching process, then the photoresist layer is removed. After that, the first substrate 102 is etched under masking of the hard mask layer 130, until the opening extends through the first substrate 102. Alternatively, the opening may also extend to the dielectric layer 110 by etching away a part of the dielectric layer 110.

In other embodiments, an anti-reflection layer (not shown in FIG. 3) may be formed on the first substrate 102 at the back surface of the wafer 100. Then, a photoresist layer is formed on the anti-reflection layer, and a pattern of the opening is formed on the photoresist layer via the photolithography process. After that, the anti-reflection layer and the first substrate 102 are etched via the etching process under masking of the photoresist layer, until the opening 140 extending through the first substrate 102 is formed.

Next, as shown in FIG. 3, a protective layer 142 may be formed at a surface of the opening 140 by depositing an insulating material. The protective layer 142 may be made of silicon oxide, silicon nitride, silicon oxynitride or the like. Alternatively, the protective layer 142 may include layers each of which is made of silicon oxide, silicon nitride, silicon oxynitride or the like. The protective layer 142 is used to insulate a pad that is formed subsequently from the first substrate 102.

In step S03, a concave-convex structure 150 is formed in the dielectric layer 110 under the opening 140. The concave-convex structure 150 includes concave portions 152-1, 152-2 and convex portions 154 that are alternately arranged. At least one of the concave portions extends to expose the interconnection layer 112, as shown in FIGS. 4 and 5.

In the embodiment of the present disclosure, the concave-convex structure 150 including concave portions 152-1, 152-2 and convex portions 154 that are alternately arranged is formed in the dielectric layer 110 under the opening, and at least one of the concave portions extends to expose the interconnection layer 112, such that electrical connection between the pad that is formed subsequently and the interconnection layer 112 is ensured.

Figure 4:
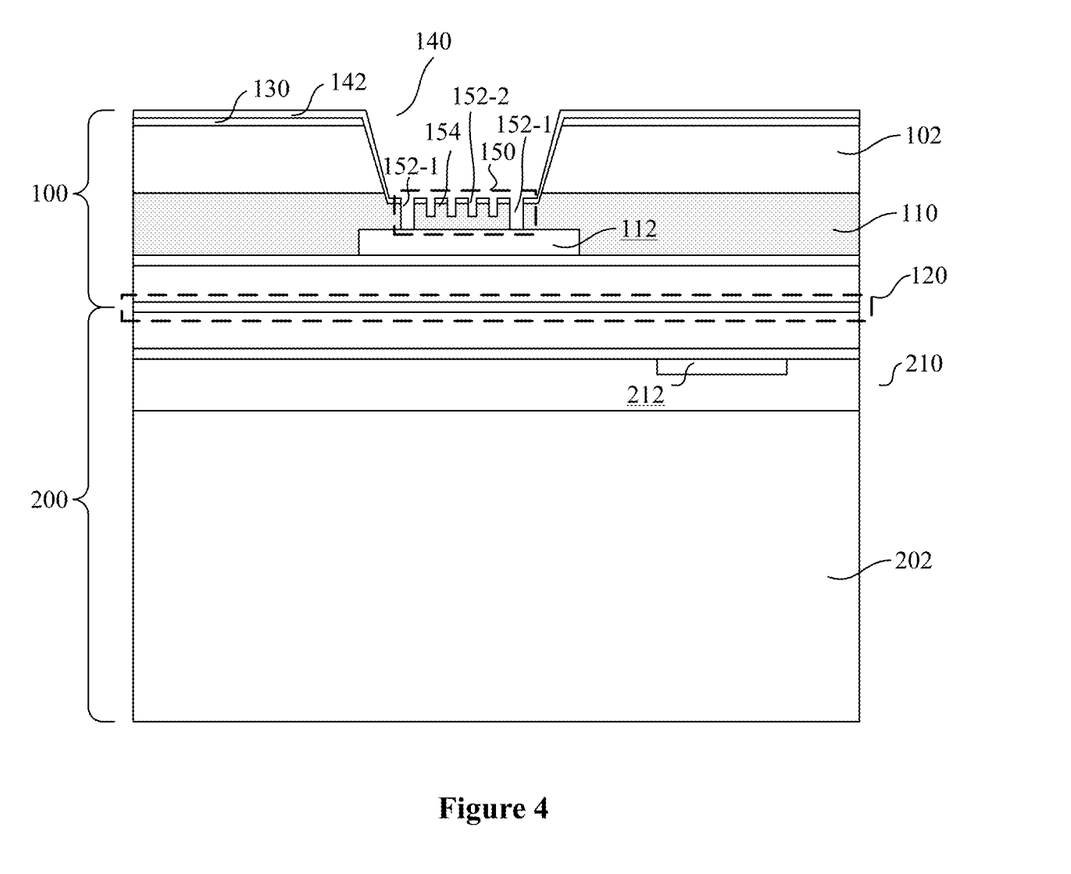
Figure 5:
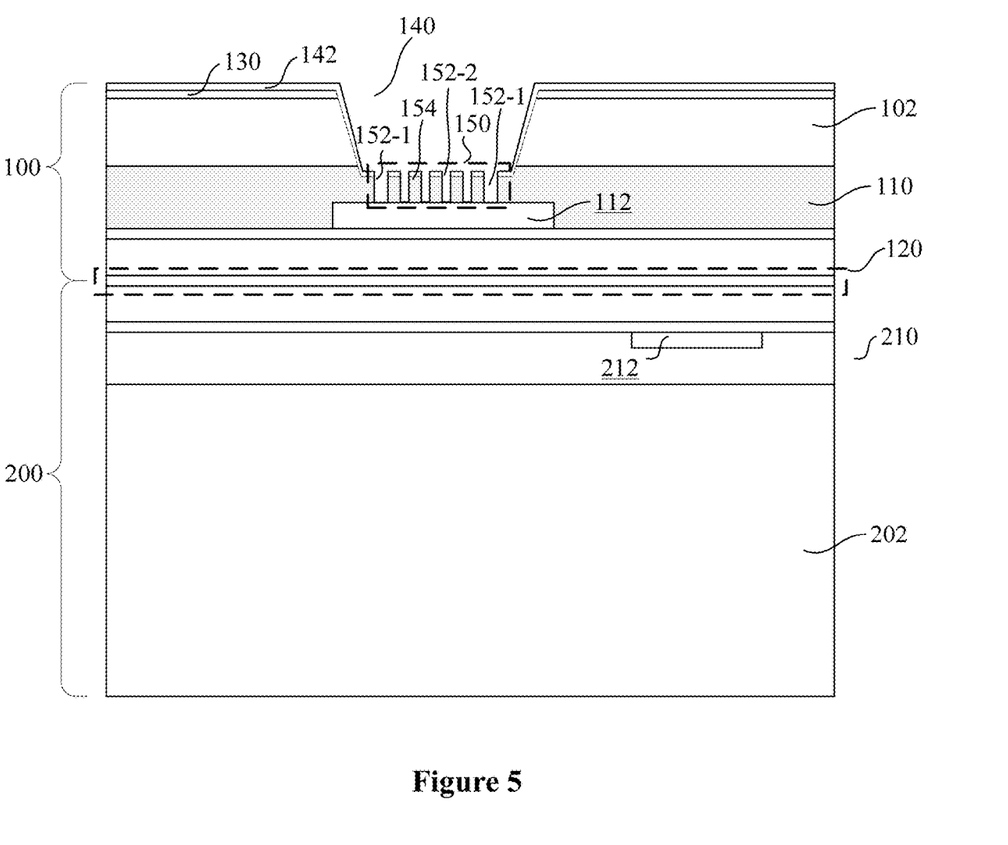

In some embodiments, some of the concave portions may extend to the interconnection layer 112, as shown in FIG. 4. In these embodiments, concave portions extending to the interconnection layer 112 are referred to as through concave portions 152-1, and concave portions not extending to the interconnection layer 112 are referred to as non-through concave portions 152-2. The dielectric layer 110 with a certain thickness is remained between each of the non-through concave portions 152-2 and the interconnection layer 112. In these embodiments, each of the through concave portions 152-1 may be arranged at a region close to a sidewall of the opening, for example, the through concave portions 152-1 may be arranged at regions close to two opposite sidewalls of the opening. Each of the non-through concave portions 152-2 may be arranged at a middle region of the opening, that is, a region of the opening between the through concave portions 152-1. Generally, during an electrical performance test, a metal probe for the test penetrates into a central part of the substrate, that is, the middle region of the opening. The non-through concave portions 152-2 are arranged at the middle region of the opening, thereby preventing the metal probe from penetrating into a metal layer.

In other embodiments, all of the concave portions 152-1 and the concave portions 152-2 may extend to the interconnection layer 112, which may facilitate integration.

Figure 6:
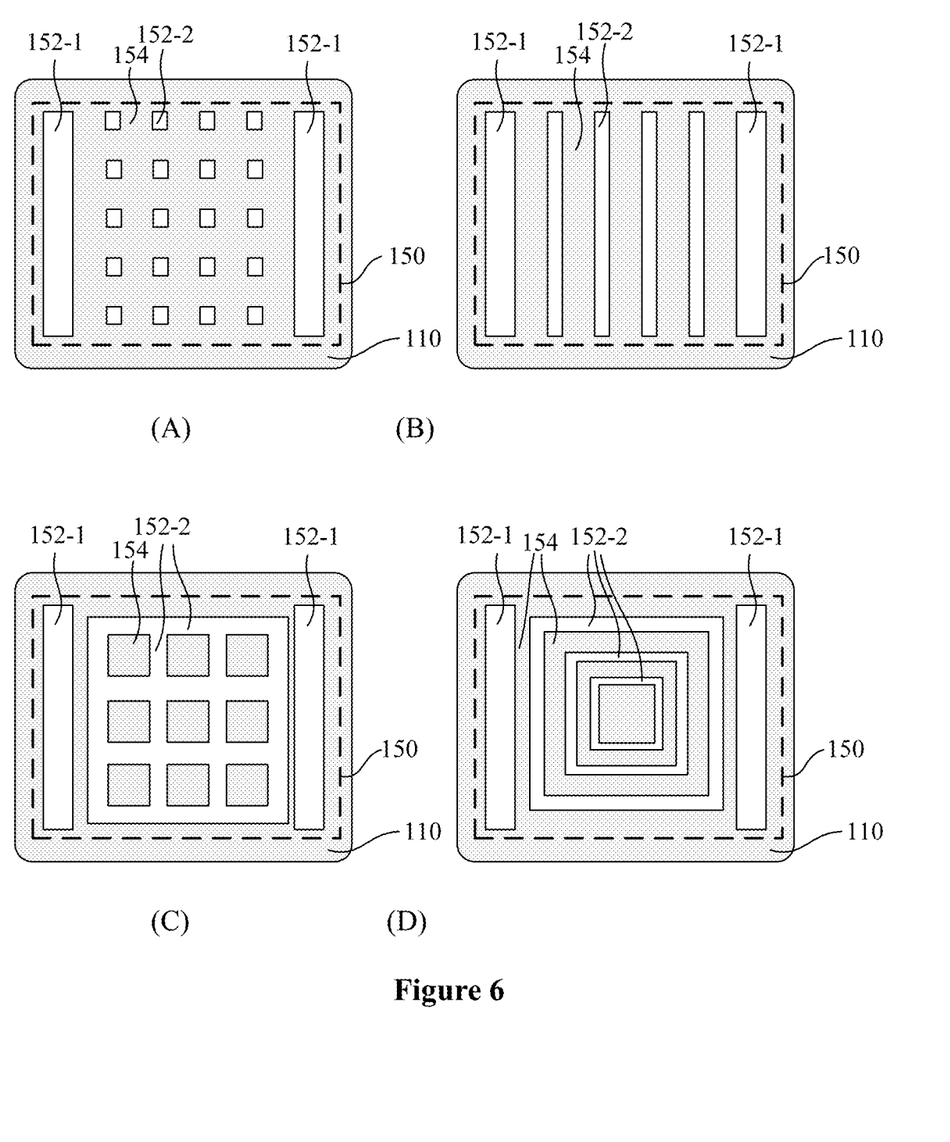

The concave-convex structure 150 may have different concave-convex arrangements, which may be performed by forming an etching pattern of the opening on a mask plate, and performing the photolithography process and the etching process using the mask plate, as shown in FIG. 6, which are schematic top views for the concave-convex structure in the opening. In these embodiments, some of the concave portions may be through concave portions 152-1, each of which is arranged at a sidewall region of the opening 140. The sidewall region may be a region close to a sidewall, regions close to multiple sidewalls or regions close to opposite sidewalls. Other concave portions may be non-through concave portions 152-2, which may be arranged at a middle region of the opening 140. The middle region may be a region of the opening away from a sidewall of the opening. In some embodiments, the through concave portions 152-1 are arranged at opposite sidewall regions of the opening 140, and the non-through concave portions 152-2 are arranged between the through concave portions 152-1.

In some applications, as shown in FIG. 6(A), the non-through concave portions 152-2 may each has a block shape and are arranged in an array, and the dielectric layer between adjacent non-through concave portions 152-2 forms the convex portion 154. In some applications, as shown in FIG. 6(B), the non-through concave portions 152-2 may each has a strip shape and are arranged in columns, and the dielectric layer between adjacent non-through concave portions 152-2 forms the convex portion 154. In some applications, as shown in FIG. 6(C), the non-through concave portions 152-2 may be arranged in a crisscross arrangement, that is, the non-through concave portions 152-2 includes vertical non-through grooves and horizontal non-through grooves that are interlaced with each other, and the dielectric layer remained among these non-through grooves forms the convex portions 154. In some applications, as shown in FIG. 6(D), the non-through concave portions 152-2 may be arranged in a nested arrangement, that is, each of the non-through concave portions 152-2 is formed as an enclosed concave ring, and the non-through concave portions 152-2 are arranged in the nested arrangement. The concave ring may be of a quadrate shape, for example, square or rectangle. The dielectric layer between adjacent enclosed concave rings forms the convex portion 154.

In an application, the concave-convex structure 150 may be formed in the dielectric layer by etching the dielectric layer 110 under the opening. A part of the dielectric layer 110 are removed by etching to form the concave portions, and the dielectric layer 110 remained without etching around the concave portions forms the convex portions. In the embodiment that an insulated protective layer 142 is formed at the surface in the opening 140, the protective layer 142 and the dielectric layer 110 are etched to form the concave-convex structure 150 in the dielectric layer under the opening 140.

In the embodiment of the present disclosure, an etching pattern of the opening with different line widths is adopted, such that both the through concave portions and the non-through concave portions are formed in one etching process, thereby simplifying the process, reducing the manufacturing cost, and improving the integration degree of the process.

Specifically, a mask layer (not shown in the drawings) with an etching pattern is formed at a bottom of the opening 140 via the photolithography process. The etching pattern includes first patterns and second patterns that are alternately arranged, where a line width of the first pattern is greater than a line width of the second pattern.

The mask layer may be a photoresist layer. Pattern with different line widths are formed on a mask plate, then the photoresist layer is processed to have the same patterns as the mask plate via the photolithography process. In this way, the photoresist layer may have the etching pattern including the first patterns and the second patterns that are alternately arranged and have different line widths, from which a to-be-etched layer is exposed. During a subsequent etching process, the to-be-etched layer under the etching pattern is etched away, and the to-be-etched layer not under the etching pattern is remained.

Next, the etching process is performed under masking of the mask layer, to completely remove the dielectric layer 110 under the first patterns and partially remove the dielectric layer 110 under the second patterns, to form the concave-convex structure 150 including the concave portions 152-1 extending through the dielectric layer 110 and the concave portions 152-2 not extending through the dielectric layer 110, as shown in FIG. 4.

Since the patterns in the etching pattern have different line widths, and etching speeds are different for different line widths, especially in an anisotropic dry etching process, a to-be-etched layer under a pattern with a large line width is etched at a high speed than the to-be-etched layer under a pattern with a small line width. In this case, the to-be-etched layer under the pattern with a large line width is etched away faster than that for a small line width during the same time period, such that the through concave portion 152-1 is formed under the pattern with a large line width, and the non-through concave portions 152-2 is formed under the pattern with a small line width.

In the embodiment of the present disclosure, the to-be-etched layer may be etched via a dry etching process, for example, a reactive ion etching (RIE) process or a plasma etching process. In this embodiment, the to-be-etched layer includes the protective layer 142 and the dielectric layer 110.

Finally, the mask layer is removed.

In this way, both the through concave portion and the non-through concave portion are formed by only performing the photolithography process and the etching process for one time.

Figure 8:
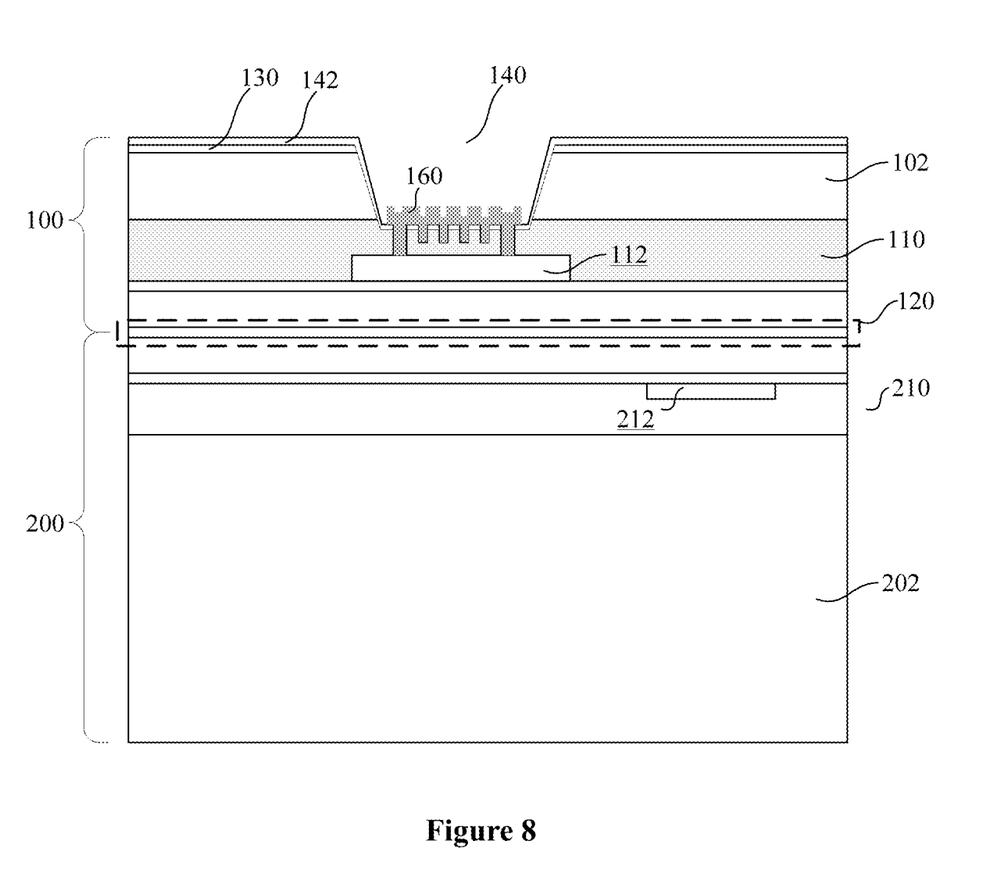

In step S04, the concave-convex structure 150 is filled, to form a pad 160 on the concave-convex structure 150. The pad 160 has the same concave-convex arrangement as the concave-convex structure 150, as shown in FIG. 8.

Since the concave-convex structure 150 has the concave-convex arrangement and a conducting material is deposited on the concave portion and the convex portion of the concave-convex structure 150 with the same thickness, a surface of the conducting material on the convex portion is higher than that of the conducting material on the concave portion after the filling process is performed. Therefore, a pad 160 thus formed has the same concave-convex arrangement as the concave-convex structure 150, that is, a surface of the pad on the convex portion of the concave-convex structure 150 is higher than that of the pad on the concave portion of the concave-convex structure 150, as shown in FIG. 8.

Figure 7:
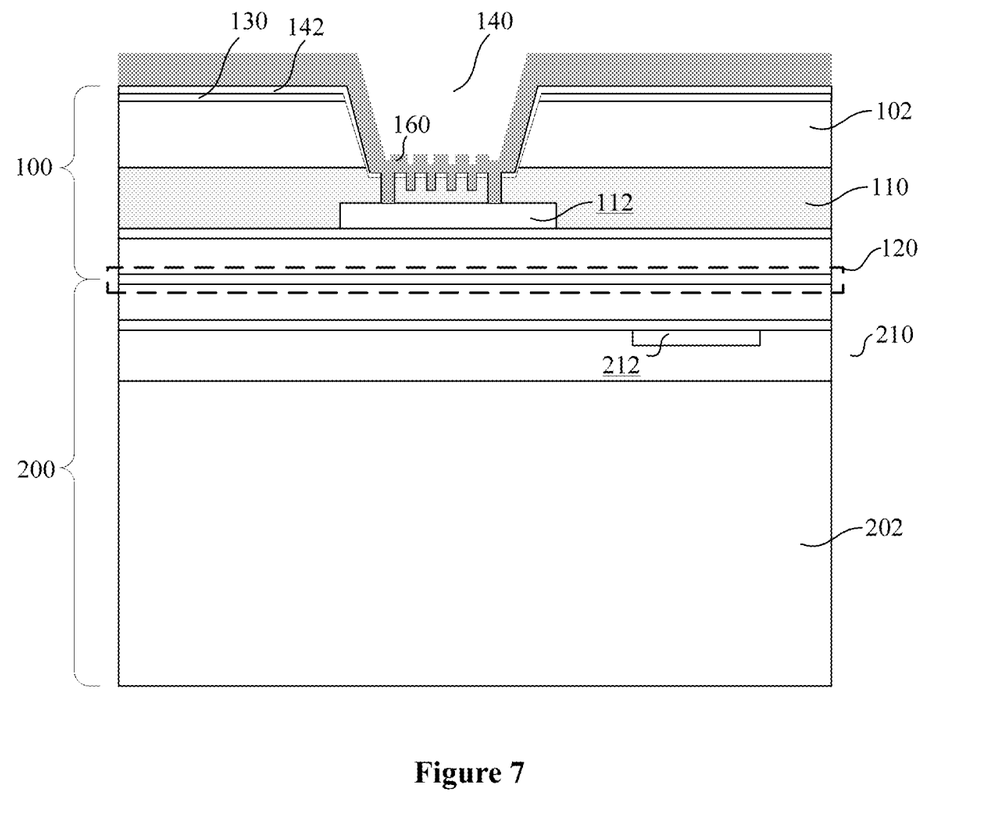

Specifically, firstly, a material of the pad 160 may be deposited, as shown in FIG. 7. The material of the pad may be a conducting material, such as aluminum, copper or the like. Next, the material of the pad is etched, to form the pad 160 in the opening 140. As shown in FIG. 8, there may be a certain distance between an edge of the pad 160 and each of sidewalls of the opening.

Figure 9:
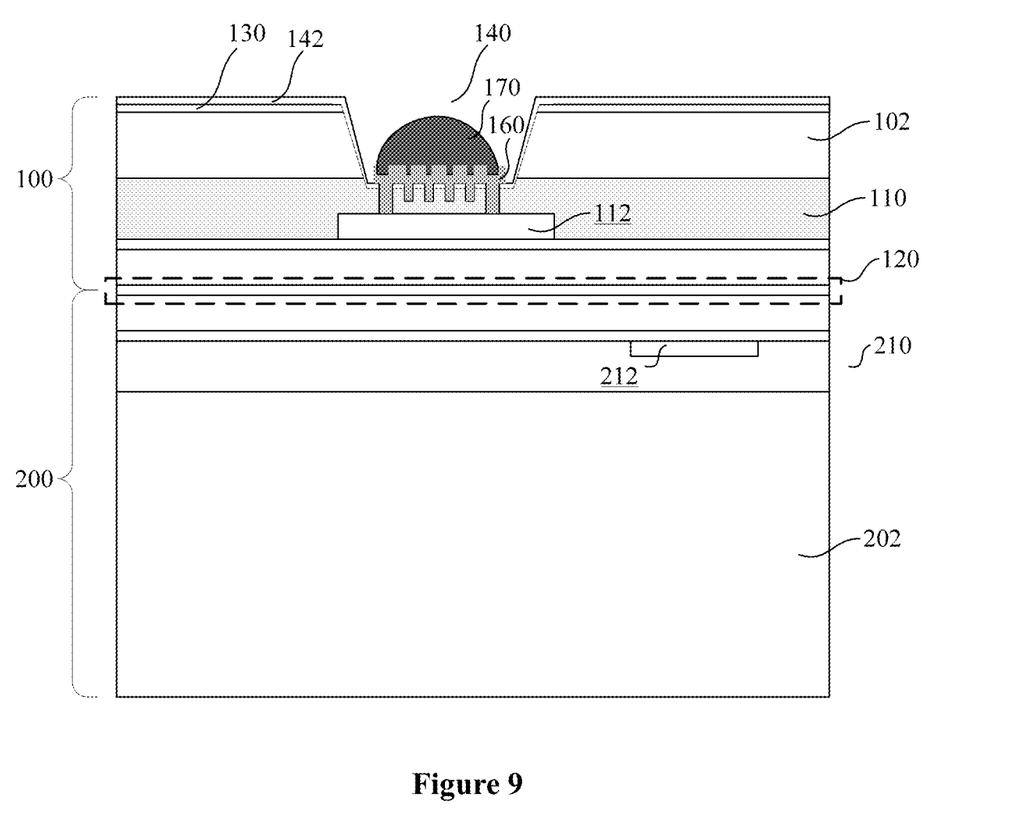

After the pad 160 having a concave-convex surface is formed, other process may be performed. A solder ball 170 may be formed on the pad 160, as shown in FIG. 9. The pad has a large contact surface area, thereby facilitating the bonding between the pad and the solder ball.

In this way, a wafer structure is formed. As shown in FIG. 1A, the wafer structure includes multiple chip structures arranged in an array. Each of the chip structures includes a first chip 1000 and a second chip 2000, front surfaces of which are bonded together. There is a cutting trench between adjacent chip structures, along which the wafer structure is cut to form separated chip structures.

A chip structure formed by cutting the above wafer structure is further provided according to the present disclosure. Reference is made to FIGS. 1A, 4 and 9, the chip structure includes a chip bonding structure, an opening 140, a concave-convex structure 150, and a pad 160. The chip bonding structure includes a first chip 1000 and a second chip 2000. A front surface of the first chip 1000 is bonded to a front surface of the second chip 2000. The first chip 1000 includes a first substrate 102, a dielectric layer 110 on the first substrate 102, and an interconnection layer 112 on the dielectric layer 110. The opening 140 extends through the first substrate 102 at a back surface of the first chip 1000. The concave-convex structure 150 is arranged in the dielectric layer 110 under the opening 140. The concave-convex structure includes concave portions 151-1, concave portions 151-2 and convex portions 154, the concave portions and the convex portions are alternately arranged, and at least one of the concave portions extends to expose the interconnection layer 112. The pad 160 is arranged on the concave-convex structure 150 and is formed by filling the concave-convex structure 150. The pad 160 has the same concave-convex arrangement as the concave-convex structure 150.

Further, the chip structure further includes a sidewall of the opening 140 and a protective layer 142. The protective layer 142 is made of an insulating material and is arranged between the pad 160 and the convex portion 154.

Further, the concave portions include through concave portions 151-1 and non-through concave portions 151-2. Each of the through concave portions 151-1 extends through the dielectric layer 110, and each of the non-through concave portions 151-2 does not extend through the dielectric layer 110. The through concave portion 151-1 is arranged at a region close to an edge of the pad 160 and the non-through concave portions 151-2 is arranged at a middle region of the pad 160.

Further, the through concave portions 151-1 may each have a strip shape. The non-through concave portions 151-2 may each have a block shape and are arranged in an array. Alternatively, the non-through concave portions 151-2 may each have a strip shape and are arranged in columns. Alternatively, the non-through concave portions 151-2 are arranged in a nested arrangement. Alternatively, the non-through concave portions 151-2 are arranged in a crisscross arrangement as a whole.

The embodiments in this specification are described in a progressive way, each of which emphasizes the differences from others, and the same or similar parts among the embodiments can be referred to each other. Since the structure disclosed in the embodiments corresponds to the method therein, the description thereof is relatively simple, and for relevant parts references may be made to the description of the method.

The above are only preferred embodiments of the present disclosure. Although the present disclosure has been disclosed in the above with the preferred embodiments, the present disclosure is not limited thereto. Numerous alternations, modifications, and equivalents can be made to the technical solution of the present disclosure by those skilled in the art according to the methods and technical content disclosed herein without deviation from the scope of the technical solution of the present disclosure. Therefore, the alternations, modifications, and equivalents made to the technical solution of the present disclosure according to the technical essences of the present disclosure without departing from the technical solutions of the present disclosure should fall within the protection scope of the present disclosure.

The invention claimed is:

1. A chip structure, comprising:
    a chip bonding structure comprising a first chip and a second chip, wherein a front surface of the first chip is bonded to a front surface of the second chip, and the first chip comprises a first substrate, a dielectric layer on the first substrate, and an interconnection layer on the dielectric layer;
    an opening arranged at a back surface of the first chip, wherein the opening is configured to extend through the first substrate;
    a concave-convex structure arranged in the dielectric layer under the opening, wherein the concave-convex structure comprises concave portions and convex portions that are alternately arranged, and at least one of the concave portions extends to expose the interconnection layer; and
    a pad arranged on the concave-convex structure, wherein the pad is configured to fill up the concave-convex structure and have a same concave-convex arrangement as the concave-convex structure,
    wherein the concave portions comprise at least two through concave portions extending through the dielectric layer and a plurality of non-through concave portions not extending through the dielectric layer, the at least two through concave portions are respectively arranged at opposite sidewall regions located close to two opposite sidewalls of the opening, and the plurality of non-through concave portions are all arranged at a middle region of the opening that between the at least two through concave portions.

2. The chip structure according to claim 1, further comprising:
a sidewall of the opening and a protective layer, wherein the protective layer is made of an insulating material and is arranged between the pad and each of the convex portions.

3. The chip structure according to claim 1, wherein each of the through concave portions has a strip shape, and the non-through concave portions each has a block shape and are arranged in an array, or the non-through concave portions each has a strip shape and are arranged in columns, or the non-through concave portions are arranged in a nested arrangement, or the non-through concave portions are arranged in a crisscross arrangement.

4. A wafer structure, comprising:
a wafer bonding structure comprising the chip structure according to claim 1, wherein the number of the chip structure is more than one, and the more than one chip structure is arranged in an array.

5. The wafer structure according to claim 4, wherein the chip structure further comprises:
a sidewall of the opening and a protective layer, wherein the protective layer is made of an insulating material and is arranged between the pad and each of the convex portions.

6. The wafer structure according to claim 4, wherein the concave portions comprise through concave portions extending through the dielectric layer and non-through concave portions not extending through the dielectric layer, each of the through concave portions is arranged at a region close to the sidewall of the opening, and each of the non-through concave portions is arranged at a region away from the sidewall of the opening.

7. The wafer structure according to claim 6, wherein each of the through concave portions has a strip shape, and the non-through concave portions each has a block shape and are arranged in an array, or the non-through concave portions each has a strip shape and are arranged in columns, or the non-through concave portions are arranged in a nested arrangement, or the non-through concave portions are arranged in a crisscross arrangement.

8. A chip, comprising:
a substrate;
a dielectric layer on the substrate; and
an interconnection layer on the dielectric layer, wherein
an opening is arranged at a back surface of the chip, and the opening is configured to extend through the substrate;
a concave-convex structure is arranged in the dielectric layer under the opening, and the concave-convex structure comprises concave portions and convex portions that are alternately arranged, and at least one of the concave portions extends to expose the interconnection layer; and
a pad is arranged on the concave-convex structure, and the pad is configured to fill up the concave-convex structure and have a same concave-convex arrangement as the concave-convex structure,
wherein the concave portions comprise at least two through concave portions extending through the dielectric layer and a plurality of non-through concave portions not extending through the dielectric layer, the at least two through concave portions are respectively arranged at opposite sidewall regions located close to two opposite sidewalls of the opening, and the plurality of non-through concave portions are all arranged at a middle region of the opening that between the at least two through concave portions.

9. The chip according to claim 8, further comprising:
a sidewall of the opening and a protective layer, wherein the protective layer is made of an insulating material and is arranged between the pad and each of the convex portions.

10. The chip according to claim 8, wherein each of the through concave portions has a strip shape, and the non-through concave portions each has a block shape and are arranged in an array, or the non-through concave portions each has a strip shape and are arranged in columns, or the non-through concave portions are arranged in a nested arrangement, or the non-through concave portions are arranged in a crisscross arrangement.

* * * * *